United States Patent [19]

Ueno

[11] Patent Number: 5,389,741
[45] Date of Patent: Feb. 14, 1995

[54] FLAT CABLE AND CONNECTION DEVICE AND METHOD FOR THE SAME

[75] Inventor: Seiichi Ueno, Kameyama, Japan

[73] Assignee: The Furukawa Electric Company, Ltd., Marunouchi, Japan

[21] Appl. No.: 61,060

[22] Filed: May 14, 1993

[30] Foreign Application Priority Data

May 16, 1992 [JP] Japan .................. 4-039461[U]

[51] Int. Cl.⁶ .................. H01B 7/08; H01R 43/00; H01R 9/07
[52] U.S. Cl. .................. 174/117 F; 29/857; 29/858; 174/117 FF; 174/84 R; 439/296; 439/345; 439/422; 439/499
[58] Field of Search ........... 174/117 F, 117 FF, 84 R, 174/92; 29/868, 869, 871, 857, 858; 439/296, 345, 422, 499

[56] References Cited

U.S. PATENT DOCUMENTS

| H595 | 3/1989 | Lafaw | 174/92 X |
|---|---|---|---|
| 3,728,661 | 4/1973 | Kassabgi | 174/117 FF |
| 3,794,522 | 2/1974 | Mueller et al. | 174/117 F |
| 4,160,871 | 7/1979 | Lacroix | 174/84 R |
| 4,513,170 | 4/1985 | Apodaca | 174/36 |
| 4,564,253 | 1/1986 | Sinclair | 439/422 |
| 4,698,457 | 10/1987 | Bordbar | 174/36 |
| 4,852,252 | 8/1989 | Ayer | 174/84 R X |
| 4,889,506 | 12/1989 | Connolly et al. | 174/84 R X |
| 4,952,256 | 8/1990 | Schauer et al. | 174/84 R X |
| 4,978,315 | 12/1990 | Edgley et al. | 439/441 |
| 5,051,544 | 9/1991 | Harris | 174/117 F |
| 5,057,650 | 10/1991 | Urushibata et al. | 439/499 |
| 5,059,134 | 10/1991 | Schauer et al. | 439/499 X |
| 5,137,468 | 8/1992 | Murakami | 439/422 |
| 5,147,510 | 9/1992 | Iura et al. | 174/117 F |
| 5,195,908 | 3/1993 | Yamamoto et al. | 439/422 |
| 5,212,348 | 5/1993 | Gibson | 174/74 R |

FOREIGN PATENT DOCUMENTS

| 2453941 | 5/1976 | Germany | 174/117 F |
|---|---|---|---|
| 14891 | 2/1977 | Japan | 174/117 F |

Primary Examiner—Morris H. Nimmo
Attorney, Agent, or Firm—Staas & Halsey

[57] ABSTRACT

A flat cable which has a connection termination with interlayer peeling films interposed between conductors and insulating films at predetermined intervals along a length of the flat cable. When connecting the flat cable, by cutting the termination with the interlayer films, the insulating film ends and interlayer film ends positioned at the cut portion are folded back to form a folded back portion. This folded back portion is made to catch on to the protective insulator of the connection device, so as to prevent poor contact etc. by ensuring that no intolerable force acts on the connection portion of the conductors even if a tensile force is applied to the connection portion. Further, in the connection termination, connection terminals are inserted between the interlayer peeling films and connectors to connect to the conductors.

16 Claims, 5 Drawing Sheets

FLAT CABLE AND CONNECTION DEVICE AND METHOD FOR THE SAME

BACKGROUND OF THE INVENTION

1. Field of the Invention

The present invention relates to a flat cable and a connection device and connection method for the same, more particularly relates to a dependable flat cable which is easy to be connected and is free from poor contact even when a tensile force acts in the longitudinal direction of the flat cable and to a connection device and connection method for the same.

2. Description of the Related Art

Figure 1:
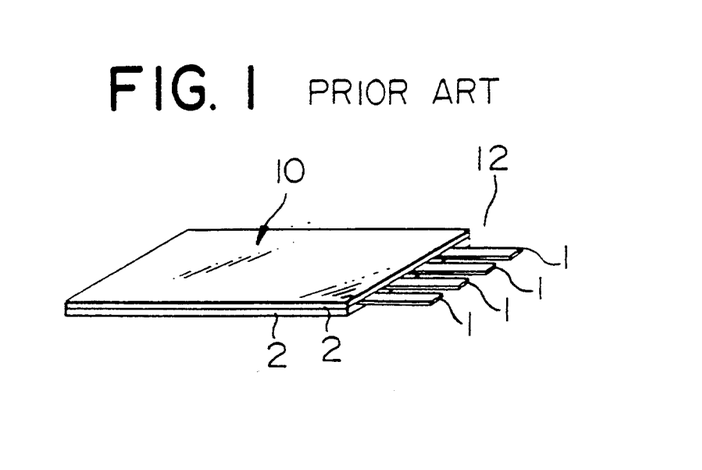
FIG. 1 is a perspective view of a conventional flat cable connection termination.

A flat cable 10 such as a flexible printed circuit (FPC) or flexible flat cable (FFC), as shown in FIG. 1, is constructed with a plurality of parallel strip-like conductors 1 sandwiched between insulating covering layers 2 comprised of insulating film, from two sides. At the connection termination 12 of the flat cable 10, the two insulating covering layers 2 are removed to expose the terminations of the conductors 1. The exposed terminations of the conductors 1 are connected, for example, to the core conductors of other cables etc.

Figure 2:
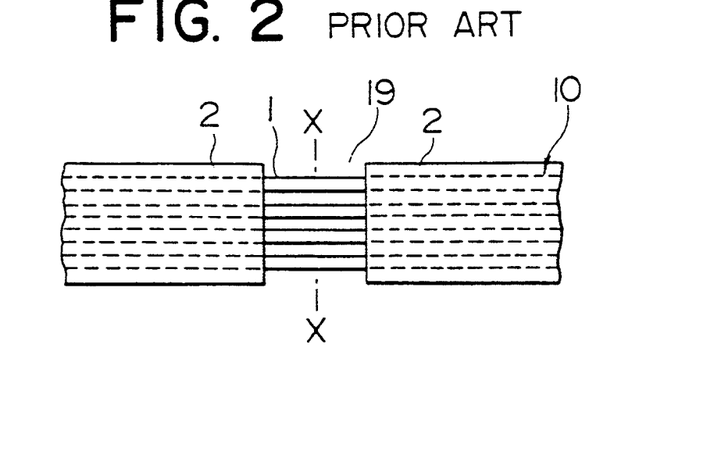
FIG. 2 is a plane view of one example of a conventional flat cable.

When a flat cable is used in a location where it is repeatedly bent or when it is used for connection to a moving part, the insulating covering layers 2 and the conductors 1 are strongly bonded by an adhesive so as to enable them to withstand the repetitive bending load. If the insulating covering layers 2 of the flat cable are strongly bonded, however, it becomes difficult to remove the insulating covering layers 2 at the connection termination when being connected to other cables or the terminations of electrical equipment. Therefore, in the past, as shown in FIG. 2, in the process for manufacturing a flat cable 10, the insulating covering layers 2 of a continuous flat cable were previously removed at regular intervals to form insulating covering layer-free portions 19 at regular intervals of the flat cable. When connecting this flat cable, the conductors 1 were cut along the line X—X at the insulating covering layer-free portion 19 closest to the portion to be connected to form a connection termination with terminations of the conductors exposed.

Production of the flat cable shown in FIG. 2 requires the removal of the insulating covering layers 2 comprised of the insulating films at predetermined intervals along the longitudinal direction of the cable. As a method for doing this, it is a workable way to provide cutaway portions in advance in the insulating films constituting the insulating covering layers in the lamination step for laminating the insulating covering layers 2 on the two sides of the parallel array of the conductors 1. Alternatively, there is the method of intermittently feeding insulating films cut to predetermined lengths and lining them up on the conductors 1 so as to provide insulating covering layer-free portions 19 with exposed conductors 1 shown in FIG. 2 at predetermined intervals on the flat cable 10.

In the flat cable having the insulating covering layer-free portions 19 shown in FIG. 2, however, since the conductors 1 are exposed at locations forming the connection terminations, the connection to other cables and equipment becomes easy, but since the conductors 1 are exposed, those portions are very likely to oxidize and discolor or are easily contaminated by dust, oil, etc. depositing on the conductors, which has a detrimental effect on the electrical connection. In addition, the exposed conductors are likely to undergo stress and deform during transport or work. When pitches are out due to deformation, faulty connection arises, or insertion into card edge connectors becomes difficult.

Figure 3:
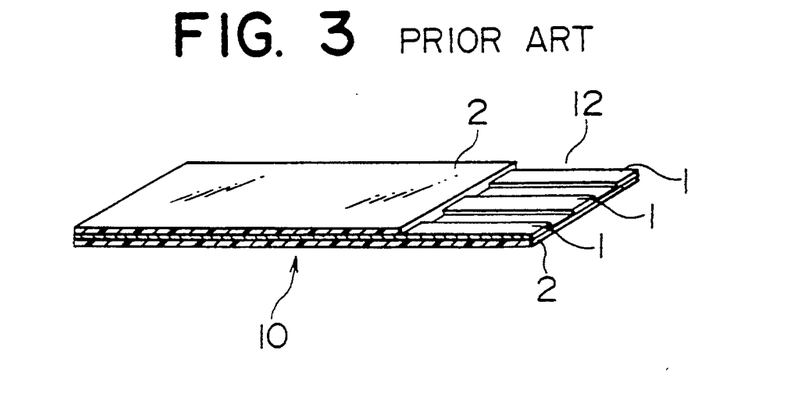
FIG. 3 is a perspective view of one example of a connection termination of another conventional flat cable.

Further, in the related art, as shown in FIG. 3, there are known the method of removing only one of the two insulating covering layers 2 of the conductors 1 at the connection termination 12, the method of removing the insulating films constituting the insulating covering layers to expose the termination portions of the conductors and adhere a separate reinforcing film on one side of the same by an adhesive, etc. With this type of cable, the conductors are connected by contact on only one side, so the reliability of the electrical contact is inferior to that of two-sided contact. Further, the termination processing is doubly troublesome and leads up to raising costs.

Figure 4:
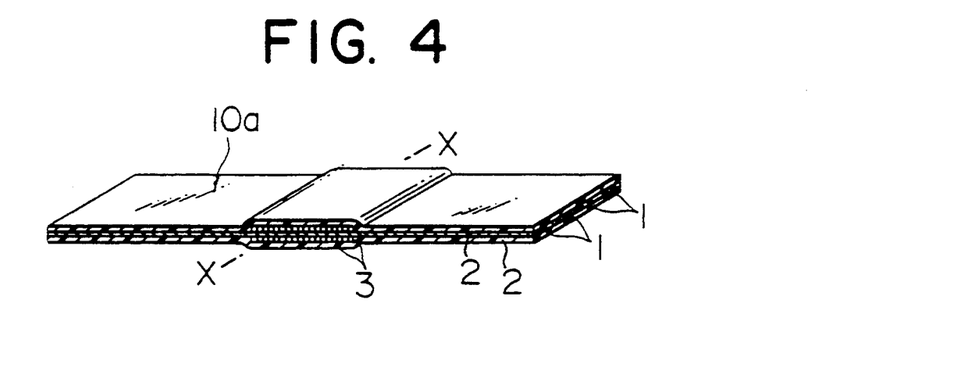
FIG. 4 is a perspective view of a flat cable proposed by the present inventors.

Considering the ease of connection, the present inventors proposed a flat cable 10 as shown in FIG. 4, where an interlayer film (peeling layer) 3 is partially sandwiched between the insulating films 2 and the conductors 1 at predetermined intervals in the longitudinal direction of the flat cable 10a without application of an adhesive so as to intermittently form portions where the conductors 1 and the insulating covering layers 2 are not adhered.

To form a connection termination of the flat cable 10a, a cut is required at the position of the peeling films 3 along the line X—X, the insulating covering layers 2 at the cut end are peeled away together with the peeling layers 3, and thus the conductors 1 are presumably exposed for connection.

Figure 5:
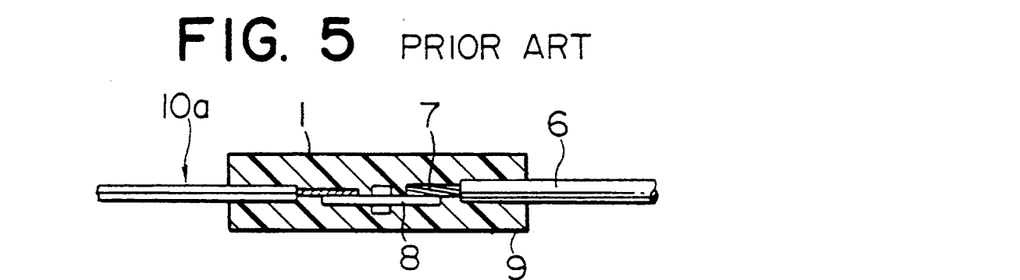
FIG. 5 is a sectional view of one example of a conventional connection device of a flat cable.

To connect the connection termination of the flat cable 10a constituted in this manner, for example, as shown in FIG. 5, the method has been devised as connecting the exposed terminations of the conductors 1 and the core conductors 7 of the cables 6 by a connection terminal 8, forming a connector body 9 by insert molding, or more commonly called injection molding, and burying the connection portion in the connector body 9.

In such a connection structure, however, when the connection portion is covered with the molded connector body 9, the connection portion of the conductors is protected against bending, but there is nothing resisting the linear tension in the longitudinal direction of the flat cable, so there is raised a problem that the connection is likely to undergo stress and the contact of the conductor connection portion easily becomes slackened off.

The present invention was made in consideration of this situation and has as its object the provision of a dependable flat cable which is easily connected and is free from poor contact even when a tensile force acts in the longitudinal direction of the flat cable and to a connection device and connection method for the same.

SUMMARY OF THE INVENTION

To achieve the above object, the flat cable of the present invention has a plurality of conductors arranged substantially in parallel, insulating covering layers adhered to the two sides of the parallel array of the plurality of conductors, and interlayer peeling layers interposed between the conductors and insulating covering layers at locations of predetermined intervals along the longitudinal direction of the cable so as to facilitate the peeling between the conductors and the insulating covering layers.

The insulating covering layers are preferably comprised of insulating films.

The interlayer peeling layers are preferably comprised of peeling film with no adhesive applied.

The interlayer peeling layers are preferably subjected to treatment to prevent oxidation and discoloration to prevent oxidation of the conductors.

The connection method of the flat cable according to a first aspect of the present invention has the step of taking a flat cable having a plurality of conductors arranged substantially in parallel, insulating covering layers adhered to the two sides of the parallel array of the plurality of conductors, and interlayer peeling layers interposed between the conductors and the insulating covering layers at locations of predetermined intervals along the longitudinal direction of the cable for facilitating the peeling between the conductors and the insulating covering layers and cutting the flat cable at a position where the interlayer peeling layers are present, a step of folding the interlayer peeling layers and the ends of the insulating covering layers corresponding to the cut portion back against the tops of the insulating covering layers to form a folded back portion and expose the ends of the conductors, and a step of housing the exposed conductor ends and folded back portion in a connection device so the folded back portion will not pull out from the device and electrically connecting the ends of the conductors to the connection terminals.

The connection method of the flat cable according to a second aspect of the present invention has the step of taking a flat cable having a plurality of conductors arranged substantially in parallel, insulating covering layers adhered to the two sides of the parallel array of the plurality of conductors, and interlayer peeling layers interposed between the conductors and the insulating covering layers at locations of predetermined intervals along the longitudinal direction of the cable for facilitating the peeling between the conductors and the insulating covering layers and cutting the flat cable at a position where the interlayer peeling layers are present, a step of folding the interlayer peeling layers and the ends of the insulating covering layers corresponding to the cut portion back against the tops of the insulating covering layers to form a folded back portion and expose the ends of the conductors, a step of holding the folded back portion on a covering holder formed in the connection terminals, and a step of electrically connecting the exposed ends of the conductors to the connection terminals.

The connection method of the flat cable according to a third aspect of the present invention has the step of taking a flat cable having a plurality of conductors arranged substantially in parallel, insulating covering layers adhered to the two sides of the parallel array of the plurality of conductors, and interlayer peeling layers interposed between the conductors and the insulating covering layers at locations of predetermined intervals along the longitudinal direction of the cable for facilitating the peeling between the conductors and the insulating covering layers, cutting the flat cable at a position where the interlayer peeling layers are present, and forming a connection termination covering the ends of the interlayer peeling layers and the ends of the insulating covering layers at the front and rear surfaces of the ends of the conductors to be connected, a step of inserting the connection terminals between the interlayer peeling layers and conductors at the said connection termination to electrically connect the connection terminals and conductors, and a step of holding the connection termination by holding pieces provided at the connection terminals.

The connection device of the flat cable of according to the present invention has a flat cable having a plurality of conductors arranged substantially in parallel, insulating covering layers adhered to the two sides of the parallel array of the plurality of conductors, and interlayer peeling layers interposed between the conductors and the insulating covering layers at locations of predetermined intervals along the longitudinal direction of the cable for facilitating the peeling between the conductors and the insulating covering layers, a connection termination where the flat cable is cut at a position where the interlayer peeling layers are present, the ends of the interlayer peeling layers and the insulating covering layers corresponding to the cut portion are folded back against the tops of the insulating covering layers to form a folded back portion, and thus exposed conductor ends are formed, connection terminals to which the exposed conductor ends are electrically connected, and an insulating protective case which houses the connection portion of the conductor ends and the connection terminals so that the folded back portion will not pull out from the device.

In the present invention, by interposing the interlayer peeling layers between the conductor ends and the insulating covering layer ends at the connection termination, it is possible to easily peel the insulating covering layer ends from the conductor ends together with the interlayer peeling layers and expose the conductor connection ends. The peeled insulating layer ends can be folded back on the insulating covering layers together with the interlayer peeling layers.

The folded back portion is engaged inside the case of the connection device so can sufficiently resist any tensile force applied to the connection portion in the longitudinal direction of the flat cable and therefore electrical contact remains firm.

The conductors of the connection termination are prevented from oxidizing and discoloring, being contaminated, deforming during transport or work, etc. since the conductors are exposed by peeling the interlayer peeling layers just before the conductors are connected.

Further, the treatment for prevention of oxidation and discoloration applied to the interlayer peeling layers prevents the oxidation and discoloration of the conductors exposed woven between the insulating covering layers and the interlayer peeling layers.

The case of the connection device formed by an insert molding protects the inside connection portion from humidity and entry of corrosive gases. Further, the connection terminals may be held by covering holders and caulked so as to strongly affix them.

In the connection termination, the interlayer peeling layers easily peel from the conductors, so it is possible to easily insert connection terminals between the conductors and the interlayer peeling layers to connect to the conductors.

BRIEF DESCRIPTION OF THE DRAWINGS

Below, an explanation will be made of the embodiments of the present invention with reference to the drawings, in which.

DESCRIPTION OF THE PREFERRED EMBODIMENTS

Figure 6:
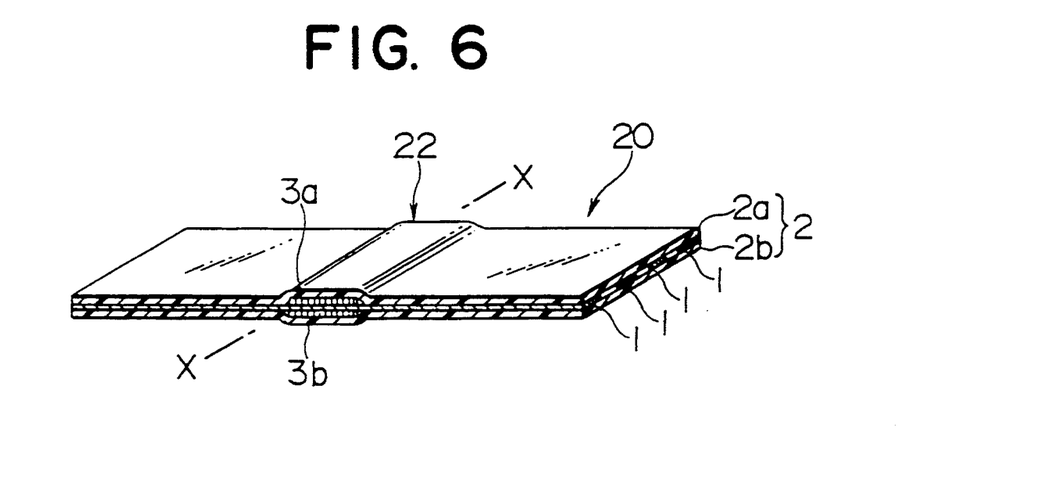
FIG. 6 is a perspective view of a location of formation of a connection termination of a flat cable according to an embodiment of the present invention.

FIG. 6 is a sectional view of a flat cable according to an embodiment of the present invention cut away in the longitudinal direction along the conductors. As shown in FIG. 6, the flat cable 20 according to the present embodiment consists of a plurality of flat conductors 1 arranged in parallel (four in the illustrated embodiment) on whose two sides insulating covering layers 2 comprised of insulating films 2a, 2b etc. are laminated. The insulating films 2a and 2b are not particularly limited, but specifically use may be made of polyester film, polyimide film, polyphenylen sulfide film, etc. The thickness of the insulating films is not particularly limited, but may be about 0.01 to 0.2 mm for example.

In the present embodiment, interlayer peeling layers 3 comprised of interlayer peeling films 3a, 3b, etc. are sandwiched in between the conductors 1 and the two insulating films 2a and 2b at predetermined intervals of the continuous flat cable. In this embodiment, the position where the interlayer peeling layers 3 are formed corresponds to the connection termination 22.

The interlayer films 3a and 3b are not coated with adhesives so as to facilitate the peeling of the insulating films 2a and 2b from the conductors 1. At the locations where the interlayer peeling films 3a and 3b are sandwiched in, the insulating films 2a and 2b can be easily peeled from the conductors 1 together with the interlayer peeling films 3a and 3b. Specifically, the interlayer peeling films 3a and 3b are for example comprised of polyester, polyvinyl chloride (PVC), or polyamid nylon. The interlayer peeling films 3a and 3b preferably are subjected to treatment to prevent conductor oxidation and discoloration, such as the addition of a discoloration preventing agent, in accordance with need, so as to prevent oxidation and discoloration of the conductors 1 exposed when peeling the insulating films 2a and 2b together with the interlayer peeling films 3a and 3b.

The interlayer films 3a and 3b, though not particularly limited to this, for example may be arranged at intervals of 500 to 5,000 mm along the longitudinal direction of the flat cable 20.

Further, the thickness of the interlayer films 3a and 3b is not particularly limited, but for example is 0.25 to 1.0 mm. Further, the length of the interlayer films 3a and 3b is about 5 to 20 mm. At portions where there are no interlayer films 3a and 3b, the insulating films 2a and 2b and the conductors 1 are strongly bonded to each other using an adhesive such as polyester or polyvinyl chloride (PVC).

The interlayer films 3a and 3b are attached at predetermined intervals along the longitudinal direction of the flat cable 20 in the step of laminating the insulating films in the process of manufacturing the flat cable 20.

Next, the connection method of the flat cable 20 of the present embodiment will be shown.

Figure 7:
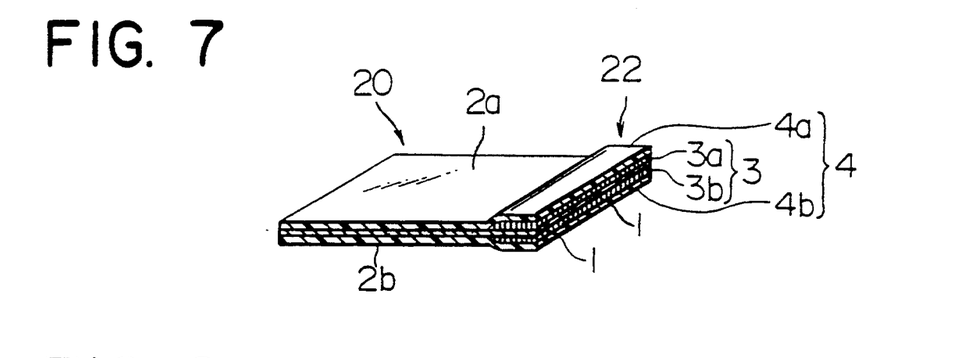
FIG. 7 is a cutaway sectional view of a flat cable connection termination of the same embodiment.

The flat cable 20 has formed on it at predetermined intervals portions for forming the connection terminations 22 (portions where interlayer films 3a and 3b are present), so the flat cable 20 is cut at the connection termination 22 positioned at the desired length of the flat cable 20. The cut state is shown in FIG. 7. As shown in FIG. 7, at the cut position, the interlayer peeling films 3a and 3b existing between the ends 4 (4a and 4b) of the insulating films 2a and 2b and the conductors 1 are exposed together with the conductors 1 at the cut end.

Figure 8:
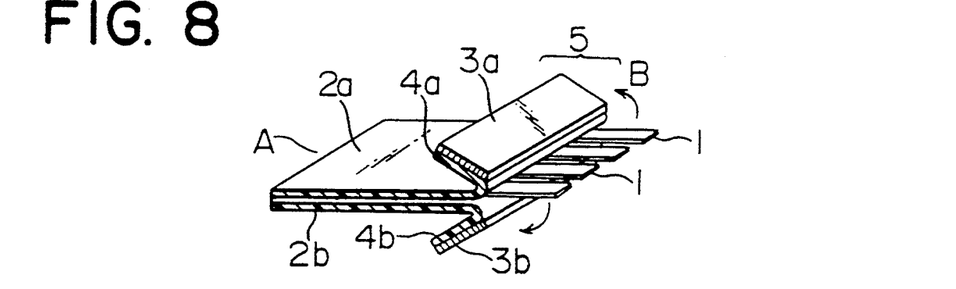
FIG. 8 is a perspective view of a folded back portion of ends of insulating films of a flat cable connection termination of the same embodiment.

In this connection termination 22, just before connecting the conductors 1, as shown in FIG. 8, the ends 4a and 4b of the insulating films 2a and 2b are peeled from the conductors 1 together with the interlayer peeling films 3a and 3b and the peeled ends 4a and 4b of the insulating films are folded back on the insulating films 2a and 2b together with the interlayer peeling films 3a and 3b to form the folded back portion 5 and expose only the conductors 1. In this way, by exposing the ends of the conductors 1 to be connected just before the connection of the conductors, there is none of the oxidation and discoloration of the exposed conductors, contamination by deposition of dust, oil, etc., deformation during transport or work, etc. which had occurred in the past as a result of exposing the conductor terminals in advance at the time of fabrication of the flat cables.

Figure 9:
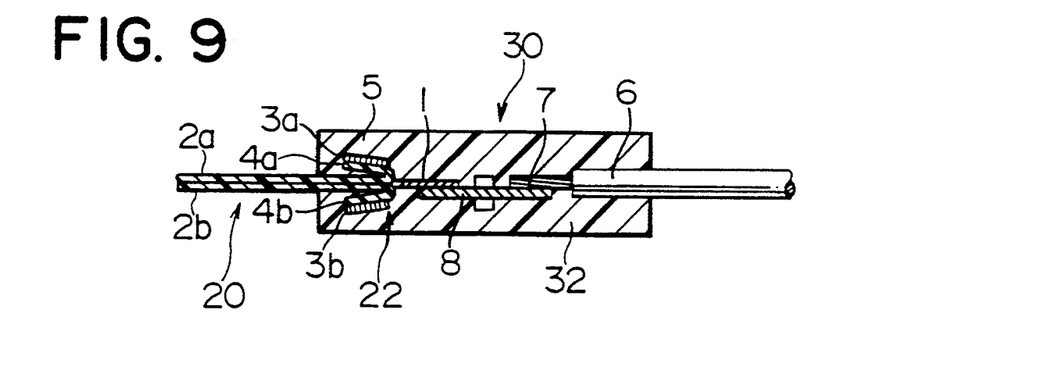
FIG. 9 is a sectional view of a connection device using the flat cable of the same embodiment.

The connection termination having the folded back portion 5 and the exposed conductors 1 is connected to cables 6 using the connection device 30 of the embodiment shown in FIG. 9. In the connection device 30 of the present embodiment, the exposed conductors 1 are connected to the core conductors 7 of the cables 6 by the connection terminals 8. The connection portion is protected by a protective insulator, for example, an insert molded plastic body 32 formed by insert molding. If a folded back portion 5 is formed and connected, even if a tensile force is applied to the flat cable 20 in its longitudinal direction, the folded back portion 5 of the insulating film ends 4a and 4b and the interlayer peeling films 3a and 3b is caught on and engaged with the insert molded plastic body 30, so the connection portion can withstand the tensile force and poor contact of the conductor connection portion can be prevented. Further, the insert molded plastic body 32 protects the connection portion from humidity and entry of corrosive gases.

Figure 10:
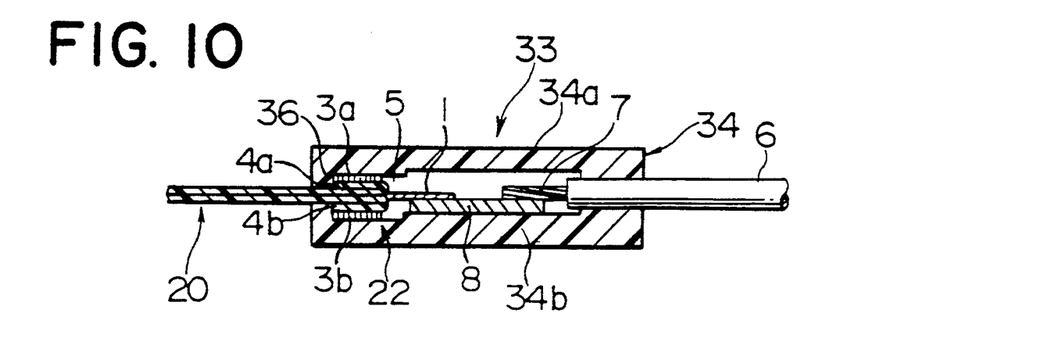
FIG. 10 is a sectional view of a connection device according to another embodiment of the present invention.

In the embodiment shown in FIG. 10, for the protective insulator constituting the connection device 33, use is made of an insulating case 34 comprised of an upper case 34a and a lower case 34b instead of the insert molded plastic body 32 of the embodiment shown in FIG. 9. In this embodiment, the connection portion consisting of the conductors 1 connected to the core conductors 7 of the cables 6 by the connection terminals 8 is housed in the insulating case 34 sandwiched from its two sides by the cases 34a and 34b. The folded back portion 5 of the insulating film ends 4a and 4b and the interlayer peeling films 3a and 3b are engaged with and affixed to the engagement steps 36 of the insulating case 34.

Figure 11:
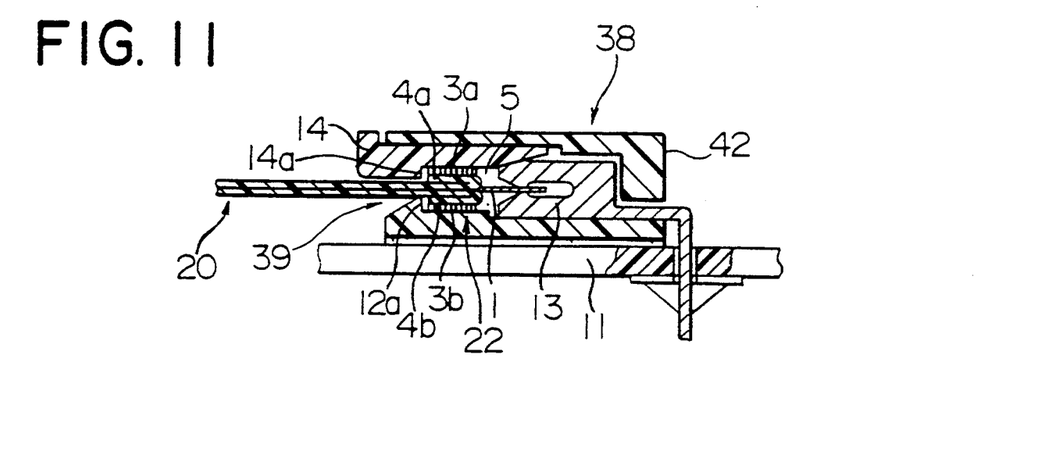
FIG. 11 is a sectional view of a connection device according to still another embodiment of the present invention.

In the embodiment shown in FIG. 11, the connection termination of the flat cable 20 is connected to an FFC connector used as the connection device 38. In this embodiment, the connection termination 22 is inserted from the insertion opening 39 of the insulating case 42 of the connection device 38 and the conductor ends of the termination are inserted in the grooves of the contact terminals 13 of the card edge connector provided in the insulating case 42 on the substrate 11. After this, a contact pressure holding key 14 is inserted from the insertion opening 39 to press down the contact terminals 13 and connect the conductors I to the contact terminals 13. The folded back portion 5 of the insulating film ends 4a and 4b and the interlayer peeling films 3a and 3b of the connection termination is engaged with the engagement step 12a of the insulating case 12 and the engagement step 14a of the contact pressure holding key 14. Further, the folded back portion 5 may be engaged with and affixed to one of the engagement steps of the insulating case 42 and the contact pressure holding key 14.

Figure 12:
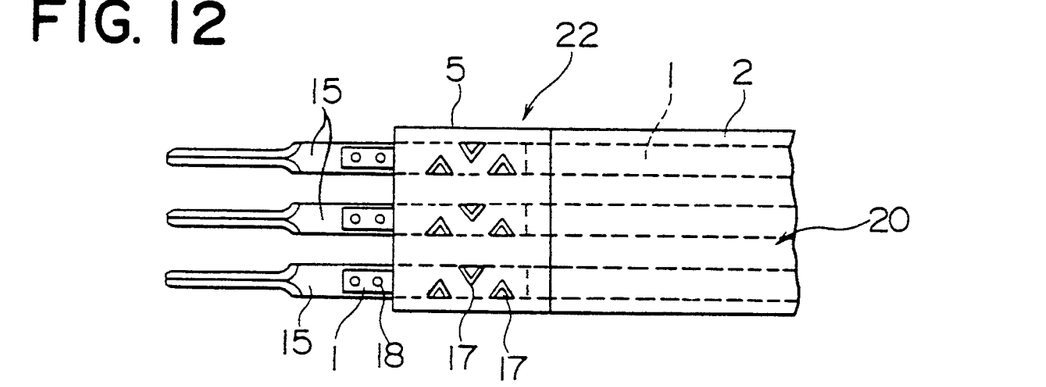
FIG. 12 is a plane view of a connection termination of a flat cable showing the connection method according to still other embodiment of the present invention.
Figure 13:
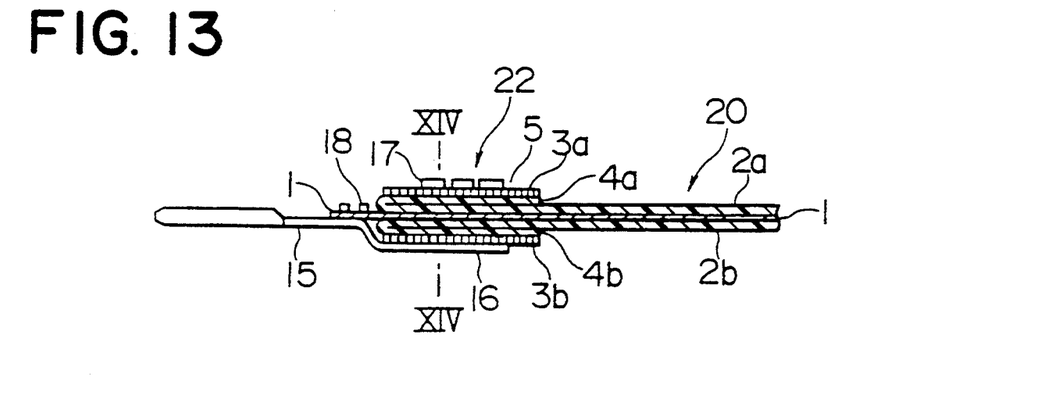
FIG. 13 is a sectional view along the longitudinal direction of the connection termination of the flat cable shown in FIG. 12.
Figure 14:
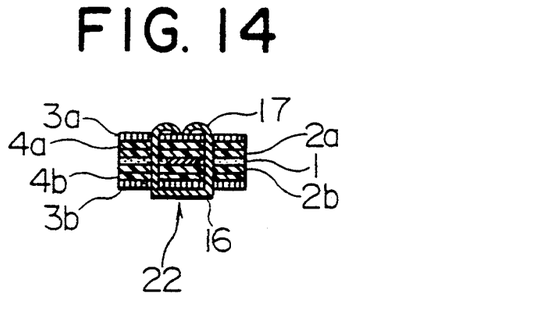
FIG. 14 is a sectional view along the line XIV—XIV of FIG. 13.

In the embodiment shown in FIG. 12 to FIG. 14, the folded back portion 5 of the insulating film ends 4a and 4b and the interlayer peeling films 3a and 3b of the connection termination 22 of the flat cable 20 is laid on the connection terminals 15 and held by the covering holder 16 of the connection terminals 15. The covering holder 16 has claws 17 formed projecting out from it. The claws 17 pierce the front and rear surfaces of the termination 22 along the conductors 1. The front ends of the claims 17 are affixed by caulking, while the exposed ends of the conductors 1 are affixed to the connection terminals 15 by the connection portion 18. In this embodiment, the insulating film ends 4a and 4b are folded back just before the connection, so the conductors 1 are not deformed or contaminated. Further, the folded back portion 5 of the insulating film is covered by the covering holder 16 and affixed by caulking, so is strongly affixed.

Figure 15:
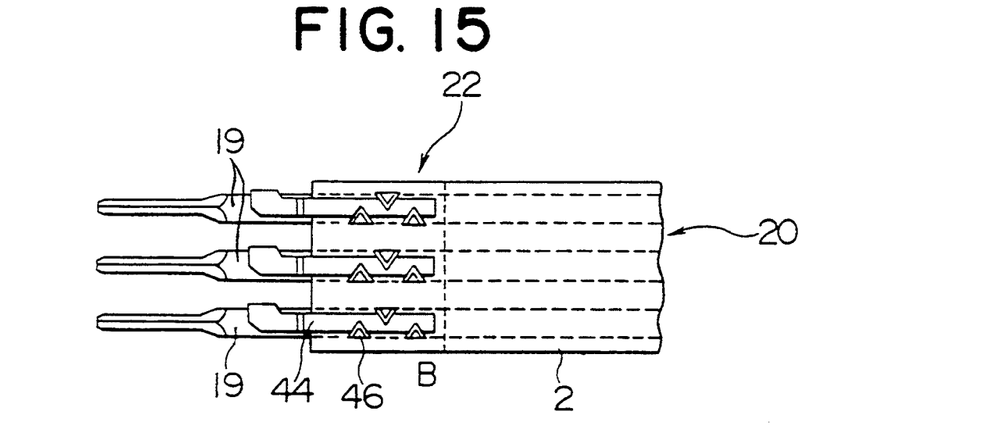
FIG. 15 is a plane view of a connection termination of a flat cable showing a connection method according to still another embodiment of the present invention.
Figure 16:
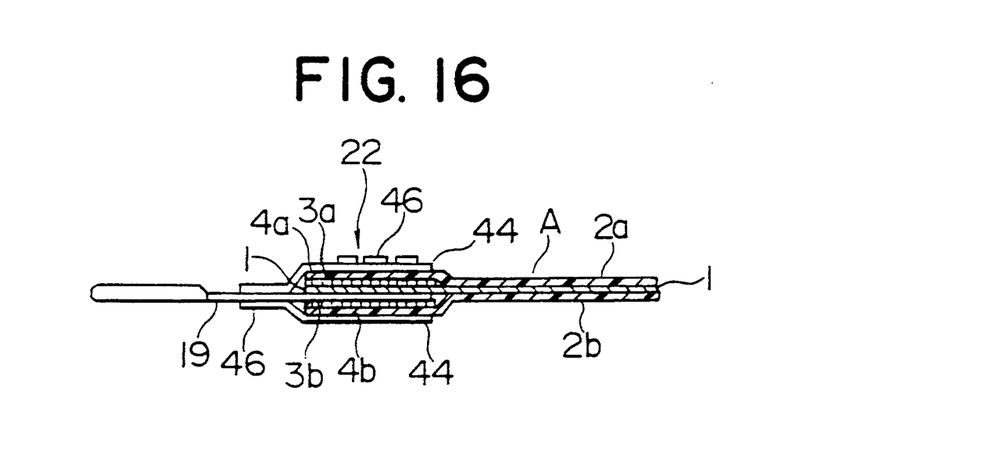
FIG. 16 is a sectional view along the longitudinal direction of the connection termination of the flat cable shown in FIG. 15.

The embodiment shown in FIG. 15 and FIG. 16 is another embodiment of the present invention. In this embodiment, there is provided a connection termination 22 having interlayer peeling films 3 interposed between the conductors 1 and the insulating film ends 4. Unlike with the embodiment shown in FIG. 8 to FIG. 14, the insulating film ends 4 and the interlayer peeling films 3 are not folded back. In this state, connection terminals 19 are inserted between the conductors of the connection termination 22 and the interlayer peeling films 3 for connection of the conductors 1. The outsides of the insulating film ends 4 are held by holding pieces 44. The claws 46 of the holding pieces 44 pierce the front and rear surfaces of the termination 22 along the conductors 1. The front ends of the claws are affixed by caulking.

In this embodiment, the interlayer peeling layers 3 are easily peeled from the conductors 1, so it is possible to easily insert the connection terminals 19 between the interlayer peeling layers 3 and the conductors 1 to connect the conductors 1.

As explained above, in the present invention, since there is provided a connection termination of a flat cable with interlayer peeling layers 3 interposed between the conductors 1 and the insulating film ends 4 wherein the insulating film ends 4 are peeled from the conductors 1 together with the interlayer peeling films 3 to expose the connection conductor termination just before the connection, it is possible to prevent the oxidation and discoloration of the exposed conductors, contamination by deposition of dust, oil, etc., deformation during transport or work, etc. which had occurred in the past as a result of exposing the conductor terminations in advance at the time of fabrication of the flat cables and it is possible to obtain a good conductor connection termination. Further, by applying treatment for prevention of oxidation and discoloration to the interlayer peeling films 3, it is possible to prevent oxidation and discoloration of the exposed conductors.

Further, in the connection termination, a folded back portion 5 of the interlayer peeling layers 3 and the insulating film ends 4 is formed and engaged with the protective insulator of the connection portion, so there is no poor contact or damage even if a tensile force is applied in the longitudinal direction of the flat cable and a connection portion with a high reliability can be obtained. Further, the folded back portion 5 can be held by a covering holder 16 and affixed by caulking, so can be strongly affixed.

Further, the interlayer peeling layers 3 of the connection termination are easily peeled from the conductors 1, so it is possible to easily insert connection terminals between the conductors 1 and the interlayer peeling films 3 to connect the conductors.

I claim:
1. A flat cable, comprising:
a plurality of conductors arranged substantially in parallel in an array,
insulating covering layers adhered to two sides of the parallel array of said plurality of conductors, and
interlayer peeling layers interposed between said conductors and said insulating covering layers at predetermined intervals along a longitudinal direction of the cable so as to facilitate the peeling between the conductors and the insulating covering layers.
2. The flat cable as set forth in claim 1, wherein the insulating covering layers comprise insulating films.
3. The flat cable as set forth in claim 1, wherein the interlayer peeling layers comprise peeling film with no adhesive applied.
4. The flat cable as set forth in claim 1, wherein the interlayer peeling layers are subjected to treatment to prevent oxidation and discoloration of the conductors.
5. A method of connecting a flat cable, comprising:
preparing a flat cable having a plurality of conductors arranged substantially in parallel in an array, insu- lating covering layers adhered to two sides of the parallel array of the plurality of conductors, and interlayer peeling layers interposed between the conductors and the insulating covering layers at predetermined intervals along a longitudinal direction of the cable for facilitating the peeling between the conductors and the insulating covering layers, cutting the flat cable at a position where the interlayer peeling layers are present, folding the interlayer peeling layers and ends of the insulating covering layers corresponding to a cut end portion of the flat cable back against tops of the insulating covering layers to form a folded back portion and expose ends of the conductors, and housing the exposed ends of the conductors and the folded back portion in a connection device so that the folded back portion engages in the connection device and electrically connecting the ends of the conductors to connection terminals in the connection device.

6. The method as set forth in claim 5, further comprising connecting the ends of the conductors electrically to the connection terminals and injection molding a connection portion thereof together with the folded back portion forming a case of the connection device.

7. The method as set forth in claim 5, further comprising connecting the ends of the conductors electrically to connection terminals and housing a connection portion thereof together with the folded back portion in an insulating case constituting the case of the connection device in a manner so that the folded back portion is engaged inside the connection device to stop from being drawn apart.

8. The method as set forth in claim 5, further comprising sandwiching the ends of the conductors, inserted from an insertion opening of an insulating case constituting a case of the connection device into the insulating case, in a groove of contact terminals of a card edge connector provided in the insulating case, connecting the ends of the conductors electrically to the contact terminals, inserting a contact pressure holding key from the insertion opening to press into the insulating case, and engaging the folded back portion in the case to stop the cable from slipping off.

9. A method of connecting a flat cable, comprising:
preparing a flat cable having a plurality of conductors arranged substantially in parallel in an array, insulating covering layers adhered to two sides of the parallel array of the plurality of conductors, and interlayer peeling layers interposed between the conductors and the insulating covering layers at predetermined intervals along a longitudinal direction of the cable for facilitating the peeling between the conductors and the insulating covering layers, cutting the flat cable at a position where the interlayer peeling layers are present, folding the interlayer peeling layers and ends of the insulating covering layers corresponding to a cut end portion of the flat cable back against tops of the insulating covering layers to form a folded back portion and expose the ends of the conductors, holding the folded back portion on a covering holder formed with connection terminals, and electrically connecting the exposed ends of the conductors to the connection terminals.

10. The method as set forth in claim 9, further comprising laying the folded back portion on the covering holder formed on the connection terminals and piercing, with claws formed on the covering holder, the front and rear surfaces of the folded back portion, so that the tips of the claws affix the folded back portion at its surface.

11. A method of connecting a flat cable, comprising:
preparing a flat cable having a plurality of conductors arranged substantially in parallel in an array, insulating covering layers adhered to the two sides of the parallel array of the plurality of conductors, and interlayer peeling layers interposed between the conductors and the insulating covering layers at predetermined intervals along the longitudinal direction of the cable for facilitating the peeling between the conductors and the insulating covering layers, cutting the flat cable at a position where the interlayer peeling layers are present to form a connection termination covering front and rear surfaces of ends of the conductors to be connected with ends of the interlayer peeling layers and ends of the insulating covering layers, inserting a connection terminal between the interlayer peeling layers and conductors at the connection termination to electrically connect the connection terminal and conductors, and holding the connection terminal by holding pieces provided at the connection termination.

12. The method as set forth in claim 11, further comprising piercing, with claws provided at the holding pieces, front and rear surfaces of the connection termination and affixing, with tips of the claws, the folded back portion at its surface.

13. A connection termination, comprising:
a flat cable having a plurality of conductors arranged substantially in parallel in an array, insulating covering layers adhered to the two sides of the parallel array of the plurality of conductors, and interlayer peeling layers interposed between the conductors and the insulating covering layers at predetermined intervals along the longitudinal direction of the cable for facilitating the peeling between the conductors and the insulating covering layers, and a connection device comprising connection terminals and an insulating protective case where the flat cable is cut at a position where the interlayer peeling layers are present, ends of the interlayer peeling layers and the insulating covering layers corresponding to a cut end portion of the flat cable are folded back against tops of the insulating covering layers to form a folded back portion, and thus exposed conductor ends are formed, where the connection terminals are connected to the exposed conductor ends electrically, and where the insulating protective case houses the connection terminals so that the folded back portion engages inside the device.

14. The connection termination as set forth in claim 13, wherein a molded plastic corresponding to the insulating protective case is injection molded by setting the connection portion in a mold together with the folded back portion and performing injection molding.

15. The connection termination as set forth in claim 13, wherein the insulating protective case comprises an upper case and a lower case.

16. The connection termination as set forth in claim 13, wherein the insulating protective case has formed in it an insertion opening through which the connection termination is inserted, the insulating protective case houses a card edge connector having contact terminals which sandwich the ends of the conductors inserted from the insertion opening, a contact pressure holding key inserted into the insertion opening after the connection termination is inserted, the connector being pressed into the case by the holding key, the folded back portion being engaged in the case, and therefore the cable being stopped from slipping off.

* * * * *

UNITED STATES PATENT AND TRADEMARK OFFICE
CERTIFICATE OF CORRECTION

PATENT NO. : 5,389,741
DATED : February 14, 1995
INVENTOR(S) : Ueno

It is certified that error appears in the above-indentified patent and that said Letters Patent is hereby corrected as shown below:

Title Page, Column 1, under [73] Assignee, line 2,
"Marunouchi, Japan" should be
--Tokyo, Japan--.

Signed and Sealed this

Thirteenth Day of June, 1995

*Attest:*

BRUCE LEHMAN

*Attesting Officer*    *Commissioner of Patents and Trademarks*